United States Patent
Kobayashi et al.

(10) Patent No.: US 6,839,124 B2
(45) Date of Patent: Jan. 4, 2005

(54) PROJECTION ALIGNER

(75) Inventors: Yoshinori Kobayashi, Tokyo (JP); Shigetomo Ishibashi, Tokyo (JP); Masato Hara, Tokyo (JP)

(73) Assignee: PENTAX Corporation, Tokyo (JP)

( * ) Notice: Subject to any disclaimer, the term of this patent is extended or adjusted under 35 U.S.C. 154(b) by 0 days.

(21) Appl. No.: 10/327,947

(22) Filed: Dec. 26, 2002

(65) Prior Publication Data

US 2003/0117607 A1 Jun. 26, 2003

(30) Foreign Application Priority Data

Dec. 26, 2001 (JP) ......................................... 2001-394058
Dec. 26, 2001 (JP) ......................................... 2001-394413

(51) Int. Cl.⁷ ........................ G03B 27/42; G03B 27/54; G01B 11/00
(52) U.S. Cl. ........................... 355/53; 355/67; 356/401
(58) Field of Search .............................. 355/53, 55, 67, 355/77; 356/400, 401

(56) References Cited

U.S. PATENT DOCUMENTS

| | | | |
|---|---|---|---|
| 5,026,145 A | | 6/1991 | Marui et al. |
| 5,062,692 A | | 11/1991 | Marui et al. |
| 5,078,474 A | | 1/1992 | Marui et al. |
| 5,625,436 A | * | 4/1997 | Yanagihara et al. .......... 355/53 |
| 5,729,331 A | * | 3/1998 | Tanaka et al. ................ 355/53 |
| 5,777,722 A | | 7/1998 | Miyazaki et al. |
| 5,959,784 A | * | 9/1999 | Seki et al. .................... 359/663 |
| 5,999,244 A | * | 12/1999 | Yanagihara et al. .......... 355/53 |
| 6,018,384 A | | 1/2000 | Ota |
| 6,157,497 A | | 12/2000 | Kumazawa |
| 6,236,448 B1 | | 5/2001 | Ota |
| 6,249,336 B1 | | 6/2001 | Ota |
| 6,351,305 B1 | | 2/2002 | Tanaka et al. |
| 6,388,735 B1 | | 5/2002 | Ota |

FOREIGN PATENT DOCUMENTS

| | | |
|---|---|---|
| JP | 49-35453 | 9/1974 |
| JP | 7-135165 | 5/1995 |
| JP | 10242040 | 9/1998 |

* cited by examiner

*Primary Examiner*—Alan Mathews
(74) *Attorney, Agent, or Firm*—Greenblum & Bernstein, P.L.C.

(57) ABSTRACT

A projection aligner scans a plurality of light beams over a mask in a main scanning direction to transfer an image of a mask pattern on an object by the light beams passed through the mask. The projection aligner has a plurality of optical systems for projecting light beams passed through the mask onto the object. Each of the optical system includes a lens unit, a reflector provided to one side of the lens unit and a deflector provided to the other side of the lens unit. The light beam passed through the mask is deflected by the deflector, passes through the lens unit, reflected back by the reflector, passes through the lens unit again, and deflected by the deflector toward the object. The size of the image formed by the light beam is varied by moving the reflector in the main scanning direction and moving the deflector in a direction perpendicular to the object. The location of the image on the object in the auxiliary direction is adjusted by further moving the reflector in the auxiliary direction.

9 Claims, 10 Drawing Sheets

200~# PROJECTION ALIGNER

BACKGROUND OF THE INVENTION

The present invention relates to a projection aligner for projecting a pattern formed on a mask onto an object to be exposed to transfer the pattern to the object.

Projection aligners have been used to form wiring patterns of PCBs (Printed Circuit Boards), transparent electrodes of LCD (Liquid Crystal Display) panels and the like. In such projection aligners, a light beam is emitted from a high-power light source, such as an ultra-high-pressure mercury-vapor lamp, toward the object through the mask.

Objects such as printed circuit boards expand/contract in size up to 0.2% due to temperature variation of the atmosphere and/or forces applied thereon during surface polishing process and/or laminating process thereof. To transfer the image of the mask pattern to the object at a correct location irrespective the expansion/contraction of the object, the projection aligners enlarge/reduce the image of the mask pattern in accordance with the expansion/contraction of the object.

There are projection aligners that scans a plurality of light beams across the mask and the object in a predetermined scanning direction to transfer the entire pattern of a large size mask to the object. If the image is enlarged or reduced in accordance with the expansion/contraction of the object in such kind of projection aligners, the images formed on the object by the plurality of light beams become to be overlapped or to be spaced apart to each other in a direction perpendicular to the scanning direction and the image cannot be transferred correctly to the object.

SUMMARY OF THE INVENTION

The present invention is advantageous in that a projection aligner is provided which is capable of correctly transferring an enlarged/reduced image of a pattern formed on a mask to an object by scanning a plurality of light beams across the mask and the object.

According to an aspect of the invention, a projection aligner is provided that is arranged to scan a plurality of light beams over the mask in a first direction to transfer an image of a pattern formed on the mask to the object by the light beams passed through the mask.

The projection aligner includes a plurality of optical systems. Each of the optical systems projects different one of the light beams passed through the mask onto the object and thereby transfer different part of the images of the pattern on the mask, or the mask pattern, to the object.

Each of the optical systems includes a lens unit, a reflector and a deflector.

The lens unit has a positive power and is arranged such that an optical axis thereof is parallel to the first direction.

The reflector is provided to one side of the lens unit, preferably in the vicinity of a focal point of the lens unit, to reflect back the light that has passed through the lens unit. The reflector is supported movably in the first direction and in a second direction which is parallel to the object and perpendicular to the first direction. In some cases, a roof mirror, whose reflection surfaces are arranged perpendicular to the mask, is utilized as the reflector. Alternatively, a rectangular prism that internally reflects the light beam by rectangular surfaces thereof and is arranged such that the rectangular surfaces are perpendicular to the mask may be also utilized as the reflector.

The deflector is provided to the other side of the lens unit. The deflector has first and second mirrors. The first mirror deflects the light beam passed through the mask toward the reflector through the lens unit. The second mirror deflects the light beam reflected by the reflector and passed through the lens unit toward the object. The deflector is supported movably in a direction perpendicular to the object. In some cases, the deflector is a triangle prism whose section is an isosceles right triangle and the first and second mirrors are formed on side surfaces of the triangle prism forming a right angle.

In the projection aligner configured as above, each of the images projected onto the object by the optical systems can be enlarged/reduced by moving the reflector in the first direction and the deflector in the direction perpendicular to the object. Further, the location of each of the images formed on the object can be shifted in the second direction, or in the direction perpendicular to the direction the light beams are scanned to transfer the images on the object, by further moving the reflector in the second direction. Thus, the projection aligner can adjust the location of each of the images such that they do not overlap to one another or have gaps therebetween in the second direction even if each of the images are enlarged or reduced in size, and thereby transfer the entire image of the pattern of the mask exactly to the object.

DETAILED DESCRIPTION OF THE EMBODIMENTS

Hereinafter, a projection aligner according to an embodiment of the present invention will be described with reference to the accompanying drawings.

Figure 1:
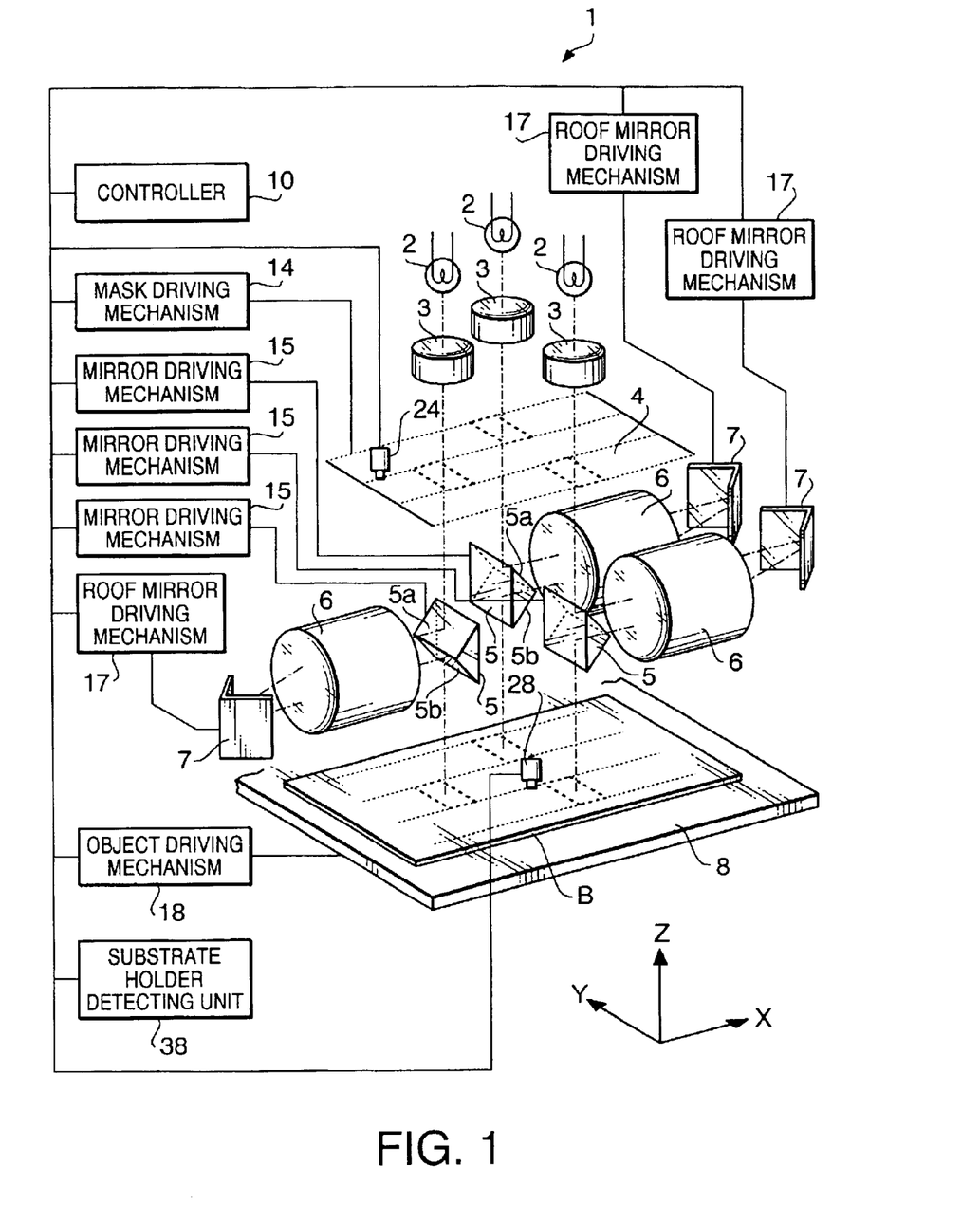
FIG. 1 schematically shows a configuration of a projection aligner according to an embodiment of the invention.

FIG. 1 schematically shows a configuration of a projection aligner 1 according to an embodiment of the invention. The projection aligner 1 has a plurality of light sources 2, a mask 4, a substrate holder 8 and a plurality of projecting optical systems. The substrate holder 8 carries a substrate B as an object to be exposed. The substrate holder 8 and the mask 4 are driven to move synchronously in the same direction for scanning.

In the following description, a direction in which the mask 4 and the substrate holder 8 move is referred to as an X-axis direction. Further, a Y-axis is defined, which is on a plane parallel to the mask 4 and perpendicular to the X-axis, and a Z-axis is defined as a direction of light beams emitted from the light sources 2 and incident on the substrate B. According to the embodiment, the light beams are perpendicularly incident on the surface of the substrate B.

Each of the projecting optical systems corresponds to different one of the light sources 2. Each projecting optical system includes a collimating lens 3, a mirror 5, a lens unit 6, and a roof mirror 7 that are arranged to project a portion of a mask pattern of the mask 4 onto the substrate B using the light beam emitted from the corresponding light source 2. The projecting optical systems are arranged such that the light beams impinge on the mask in two rows in a staggered configuration which extends in the y-axis direction and such that the whole mask pattern can be transferred onto the substrate B by a single scan (i.e., only by moving the substrate B and the mask 4 in one-way). Note that the mirror 5, lens unit 6 and the roof mirror 7 of adjacent projecting optical systems are arranged in opposite direction so that they do not interfere to each other.

The wavelength and output power of the light source 2 are determined such that the photosensitive material applied on the substrate B is sensitive to the light. An example of such a light source 2 is an ultrahigh-pressure mercury-vapor lamp. Each of the light beams emitted from the light sources 2 irradiate a strip of an area on the mask 4, through the collimating lenses 3. The light beams transmitted through the mask 4 are reflected by the mirrors 5.

The mirror 5 includes two reflection planes, i.e., first and second plane mirrors 5a and 5b. The mirror 5 is arranged such that the first plane mirror 5a deflects the light beam that has passed through the mask 4 toward the lens unit 6 and such that the second plane mirror 5b deflects the light beam coming from the lens unit 6 toward the substrate B.

In the present embodiment, the mirror 5 is formed in a triangular prism whose cross section on an X-Z plane is a right-angled isosceles triangle. The mirror 5 is arranged such that a normal to each of the first and second plane mirrors 5a and 5b forms 45 degrees with respect to the X-axis, and a ridge line formed by the first and second plane mirrors 5a and 5b extends in the Y-axis direction.

The first plane mirror 5a reflects the light beam transmitted through the mask 4 to proceed in the X-axis direction so that the light beam is incident on the lens unit 6. The light beam passed through the lens unit 6 is reflected by the roof prism 7 and is incident on the lens unit 6 again. The second plane mirror 5b reflects the light beam emerging from the lens unit 6 to proceed in the Z-axis direction so that the light beam is incident on the substrate B. Thus, the light beam passes through the lens unit 6 twice and forms an image of the mask pattern on the substrate B.

The lens unit 6 includes a plurality of lens elements arranged in the X-axis direction, and has a positive power as a whole.

The roof mirror 7 has a pair of mirror surfaces that are inwardly directed to form 90 degrees in the X-Y plane. The light beam emerged from the lens unit 6 is reflected by the roof mirror 7, returns to the lens unit 6 in a direction in parallel with the incident direction in the XY-plane. The roof mirror 7 is positioned near a focal point of the lens unit 6. With this arrangement, an erect image of the pattern of the mask 4 is formed on the substrate B. A right angle prism that internally reflects the light beam by surfaces forming the right angle can be used instead of the roof mirror 7.

The projection aligner 1 is also provided with a mask-driving mechanism 14 and an object-driving mechanism 18 for synchronously moving the mask 4 and the substrate holder 8, respectively, in the x-axis direction. A mirror driving mechanism 15 is also provided for each mirror 5 for positioning the mirror 5 in both x-axis and z-axis direction. Further, a roof mirror driving mechanism 17 is provided for each roof mirror 7 for positioning the roof mirror 7 in both x-axis and y-axis directions.

The projection aligner 1 includes a mask-position detector 24 that includes an illuminator for illuminating the mask 4 and a CCD camera for capturing the entire image of the mask 4 illuminated by the illuminator, and an object-position detector 28 that includes an illuminator for illuminating the substrate B and a CCD camera for capturing the entire image of the substrate B illuminated by the illuminator. The wavelength and light amount of the illuminators are determined to be ones to which the photosensitive material applied on the substrate B is not sensitive.

Both the mask 4 and substrate B have alignment marks near each corner thereof. A controller 10 specifies the positions of those alignment marks in the image captured by the CCD cameras and determines the longitudinal and transverse sizes of the substrate and the mask from those positions. The controller 10 further determines the expansion ratio of the image of the mask pattern to be transferred onto the substrate B. Note that, each of the mask-position detector 24 and the object-position detector 28 may include a plurality of cameras each arranged to capture a small area around different one of the alignment marks to allow determination of the position of each of the alignment marks, and in turn the determination of the expansion ratio, in high accuracy.

The projection aligner 1 further includes a substrate height detecting unit 38 for detecting the position of the photosensitive surface of the substrate B in the z-axis direction.

Figure 2:
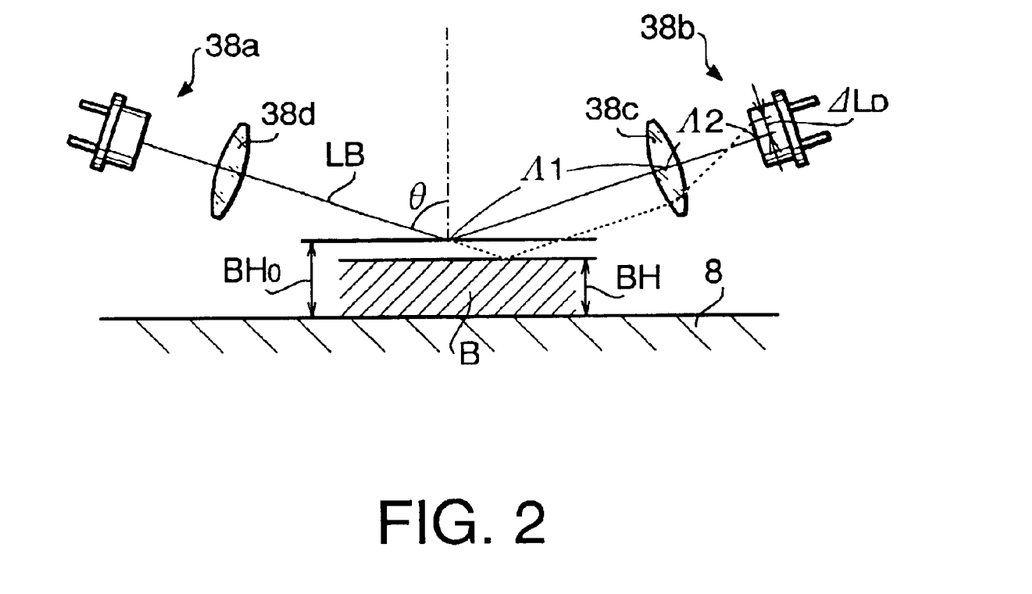
FIG. 2 schematically shows a configuration of a substrate height detecting unit of the projection aligner shown in FIG. 1.

FIG. 2 schematically shows the configuration of the substrate height detecting unit 38. The substrate height detecting unit 38 includes a laser source 38a, a photo-detector 38b, and two converging lenses 38c and 38d.

The laser source 38a emits a laser beam LB toward the photosensitive surface of the substrate B at an predetermined incident angle of θ. The wavelength and power of the laser beam LB is selected so that the laser beam LB does not expose the photosensitive material applied on the substrate B. One of the converging lens 38d is placed in front of the laser source 38a to form a beam spot on the substrate B.

The photo-detector 38b is arranged to receive the laser beam LB reflected at the substrate B. A one dimensional position sensitive detector may be utilized as the photo-detector 38b, which includes an elongated light receiving surface and being able to detect the position of the light incident thereon.

The other converging lens 38c is placed in front of the photo-detector 38b to form an image of the beam spot reflected at the substrate B on the light receiving surface of the photo-detector 38b.

The photo-detector 38b and the converging lens 38c are arranged so that the image of the beam spot is formed at the center of the light receiving surface of the photo-detector 38b when the photosensitive surface of the substrate B is located at a distance $BH_0$ from the substrate holder in the z axis direction.

In the substrate height detecting unit 38 configured as above, the position where the laser beam LB is reflected on the substrate B, and in turn the position where the beam spot is formed on the photo-detector 38b, displaces if the height of the substrate B or the position of the photosensitive surface of the substrate B in the z-axis direction changes.

The displacement in the z-axis direction of the photosensitive surface of the substrate B and the displacement of the beam spot formed on the photo-detector 38b are proportional to each other. Thus, the height BH of the photosensitive surface of the substrate B from the substrate holder 8 can be derived from the following equation:

$$BH = BH_0 - (\Delta L_D/\mu) \times (\sin(\pi/2 - \theta)/\sin 2(\pi/2 - \theta)) \quad (1)$$

where, $\Delta L_D$ represents the displacement of the beam spot on the photo-detector 38b from the center thereon, and $\mu$ represents the magnification of the image formed on the photo-detector 38b by the converging lens 38c which is generally equal to the ratio of length of the optical path between the photo-detector 38b and the converging lens 38c, $\Lambda_2$, to that between the converging lens 38c and the photosensitive surface of the substrate B, $\Lambda_1$, that is $\Lambda_2/\Lambda_1$.

Note that a database may be provided to the projection aligner, which includes data on the relation between BH and $\Delta L_D$ that is prepared experimentally, so that the height of the photosensitive surface of the substrate B can be determined based on the data of that database instead of utilizing equation (1).

Hereinafter, the operation of the projection aligner 1 shown in FIG. 1 will be described.

First, the projection aligner 1 adjusts the focus of the projecting optical system to form a clear image of the mask pattern on the photosensitive surface of the substrate B. The focusing of the projecting optical system is achieved by the following procedure.

First, the controller 10 determines the height BH of the substrate B based on the output of the substrate height detecting unit 38 and equation (1). Then, the controller 10 calculates the sum of the optical path length from the mask 4 to the lens unit 6 and that from the lens unit 6 to the photosensitive surface of the substrate B, which will be referred to hereinafter as a total optical pass length $D_L$, based on the height of the substrate, BH, and the position of the mirror 5.

The focusing of the projecting optical system is achieved when the photosensitive surface of the substrate B is placed at a location optically conjugate to the mask 4 with respect to the lens unit 6, that is, when the total optical pass length $D_L$ is twice as long as the focal length f of the lens unit 6. The controller 10 determines whether the substrate B is at a location optically conjugate to the mask 4 or not by subtracting the double of the focusing length f of the lens unit 6 from the total optical pass length $D_L$. If the length difference $\Delta D_L$ obtained as a result of the subtraction above is not zero, then the controller 10 adjust the focusing of the projecting optical system by operating the mirror driving mechanism 15 to move the mirror 5 in the x-axis direction.

Figure 3:
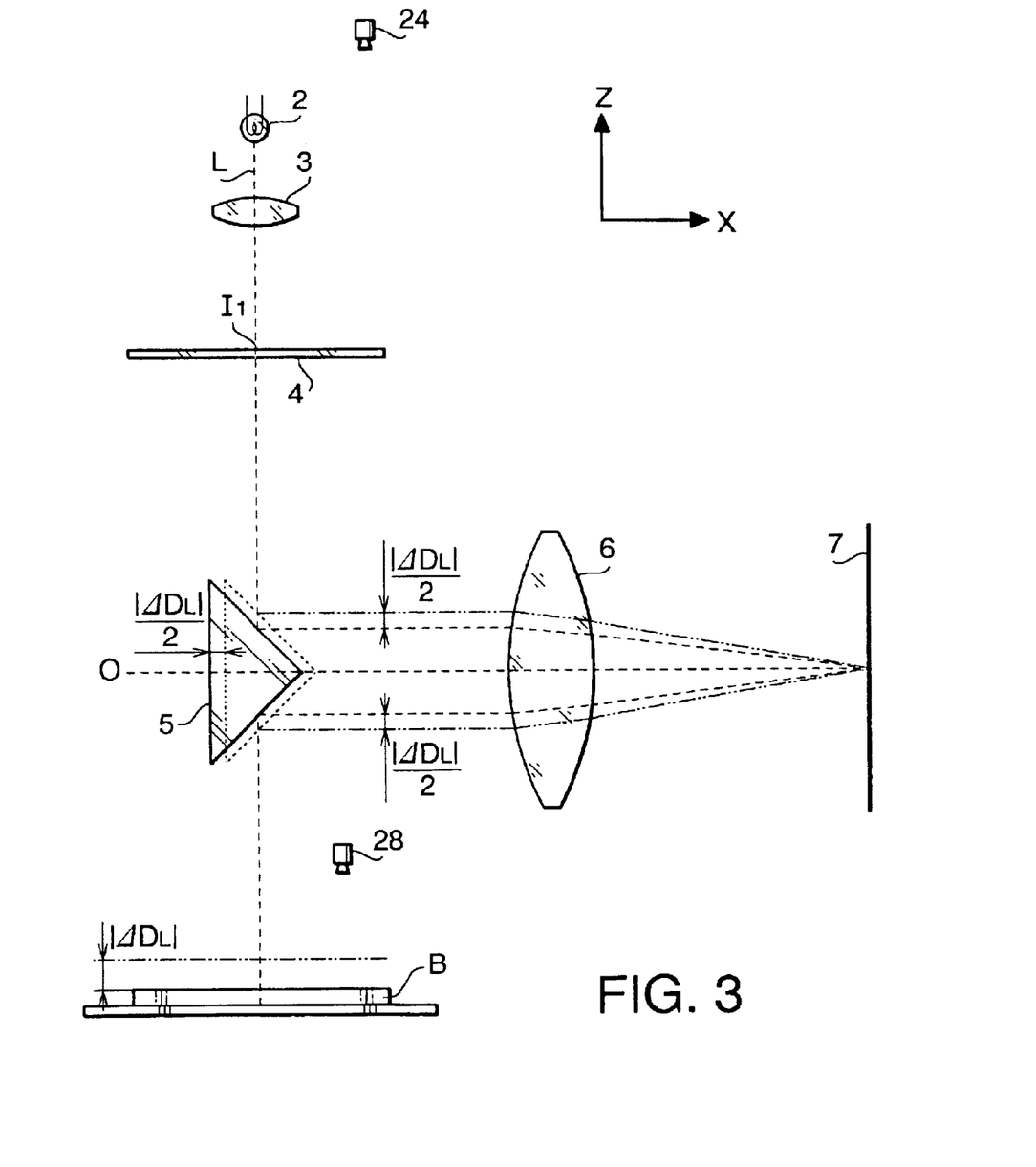
FIG. 3 schematically shows a side view of the projection aligner of FIG. 1.

FIG. 3 schematically shows the side view of the projection aligner 1 of FIG. 1 observed from the y-axis direction. Note that, in FIG. 3, only one of the projection optical system is shown and the lens unit 6 and the roof mirror 7 are indicated as a single lens and a single plane mirror, respectively, for the purpose of clarity only.

In the projection aligner 1 according to the present embodiment, the total optical pass length $D_L$ can be changed by moving the mirror 5 in the x-axis direction. As may be understood from FIG. 3, if the mirror 5 is moved for a distance of $|\Delta D_L|/2$ in the x-axis direction, both of the optical path from the mask 4 to first plane mirror 5a and the optical path from the second plane mirror 5b to the substrate B changes in length for $|\Delta D_L|/2$ since the first and second plane mirrors 5a and 5b of the mirror 5 are inclined against the x-axis at an angle of 45 degree. As a result, the total optical path length $D_L$ changes for $|\Delta D_L|$, that is, increases $|\Delta D_L|$ when the mirror 5 is moved in the direction away from the lens unit 6 and decreases $|\Delta D_L|$ if moved toward the lens unit 6.

Accordingly, if $\Delta D_L > 0$, the controller 10 moves the mirror 5 for a distance of $|\Delta D_L|/2$ toward the lens unit 6, and if $\Delta D_L < 0$, in a direction away from the lens unit 6. By moving the mirror 5 as above, the total optical path length $D_L$ becomes as long as two times of the focal length f of the lens unit 6 and, as a result, the image of the mask pattern is formed on the substrate with vivid clarity.

After the focusing of the projecting optical system, the projection aligner 1 determines the size ratio of the substrate B to the mask 4 and adjust the magnification of the projecting optical system, or the expansion ratio of the image of the mask pattern transferred onto the substrate B, in accordance with the size ratio obtained.

The size ratio of the substrate B to the mask 4 is determined based on the distances between alignment marks formed on the substrate B and the mask 4.

Figure 4:
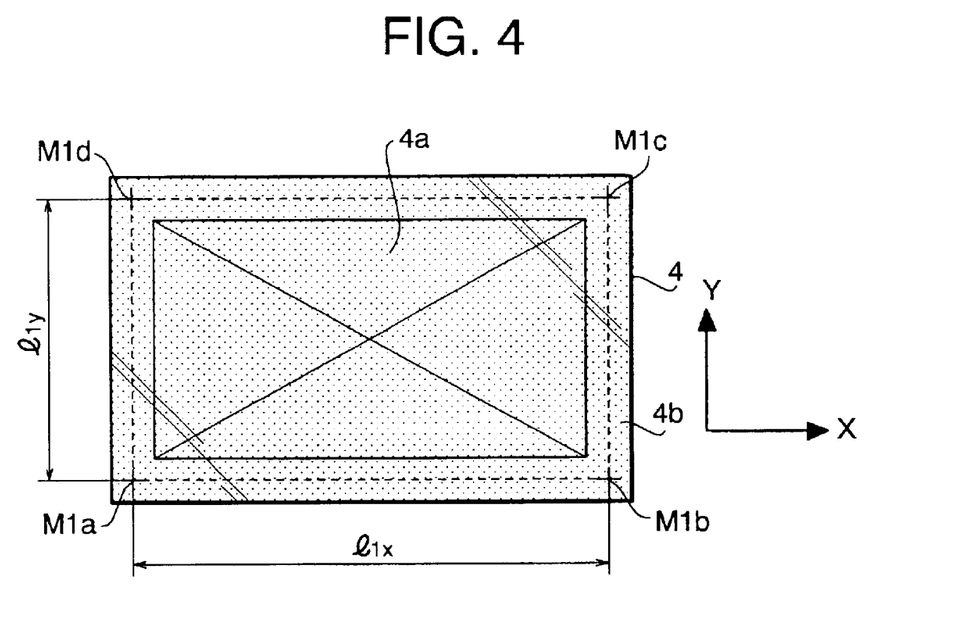
FIG. 4 schematically shows a top view of a mask 4 of the projection aligner of FIG. 1.

FIG. 4 schematically shows a top view of the mask 4. The mask 4 has a rectangular shape and is held in the projection aligner 1 such that each side thereof is parallel to either the x-axis or the y-axis. The mask pattern is formed at a middle area of the mask 4 indicated by reference numeral 4a and will be referred to as a mask pattern area 4a in this specification. The mask pattern area 4a is surrounded by an area 4b to which no pattern is formed.

The mask 4 is provided with alignment marks M1a, M1b, M1c, and M1d. The alignment marks M1a, M1b, M1c, and M1d are formed at each corner of a virtual rectangular on the mask which is shown in broken line in FIG. 4. The virtual rectangular encloses the whole mask pattern area 4a and is defined by sides parallel to the sides of the mask 4.

The controller 10 operates the camera of the mask-position detector 24 to capture the image of the whole mask 4 and determines the lengths of the mask 4 in the x-axis direction (the direction the light beams are scanned over the mask) and in the y-axis direction (the direction perpendicular to the direction the light beams are scanned) from the distances between the marks M1a, M1b, M1c and M1d in the image obtained. More specifically, the controller 10 calculates the average of the distance between the marks M1a and M1b and the distance between the marks M1c and M1d as the length of the mask 4 in the x-axis direction, $l_{1x}$. Similarly, the controller calculates the average of the distance between the marks M1b and M1c and the distance between the marks M1a and M1d as the length of the mask 4 in the y-axis direction, $l_{1y}$.

Figure 5:
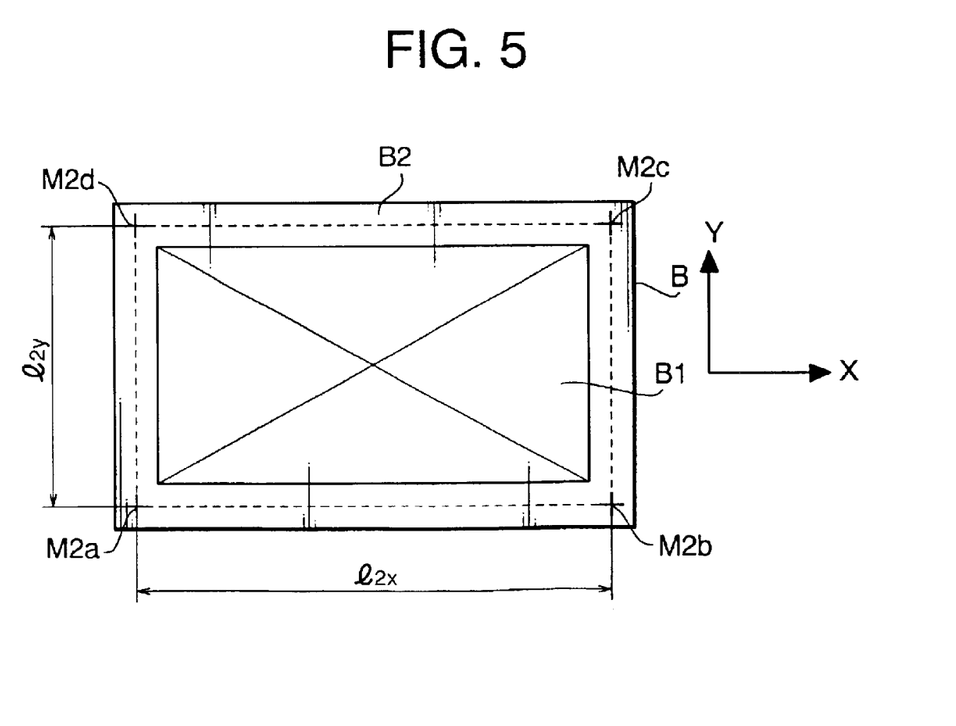
FIG. 5 schematically shows a top view of a substrate B to be exposed by the projection aligner of FIG. 1.

FIG. 5 schematically shows a top view of the substrate B. Similar to the mask 4, the substrate B normally has an elongated rectangular shape and is held by the substrate holder 8 such that its sides are parallel to the x axis (the longitudinal direction of the substrate B) and the y-axis (the transverse direction of the substrate B). The middle portion of the substrate B is a pattern area B1 onto which the mask pattern is to be transferred.

The substrate B is provided with alignment marks M2$a$, M2$b$, M2$c$ and M2$d$ of which the positional relations, especially the distances between them, are the same as that of the alignment marks M1$a$, M1$b$, M1$c$ and M1$d$ of the mask 4 if the substrate B is not expanded or contracted from its original size.

The controller 10 operates the object-position detector 28 to capture the image of the whole substrate B and determines the lengths $l_{2x}$ and $l_{2y}$ of the substrate B in the x-axis and the y-axis directions, respectively, from the positions of the marks M2$a$, M2$b$, M2$c$ and M2$d$ in the captured image in a similar manner to that described above in relation with the mask 4.

Next, the controller 10 adjusts the magnification of the projection optical system, Mgn, to a value between a first size ratio SR1 and a second size ratio SR2, where the first size ratio SR1 is the length ratio of the substrate B to the mask 4 in x-axis direction, i.e., SR1=$l_{2x}/l_{1x}$, and the second size ratio SR2 that in y-axis direction, i.e., SR2=$l_{2y}/l_{1y}$.

For example, the controller 10 adjusts the magnification Mgn to a value derived from the following equation:

$$Mgn=(l_{2x}+l_{2y})/(l_{1x}+l_{1y}) \quad (2)$$

Alternatively, the controller 10 may adjust the magnification Mgn of the projecting optical system to one of the followings:

$$Mgn=(l_{2x}/l_{1x}+l_{2y}/l_{1y})/2 \quad (3)$$

$$Mgn=l_{2x}/l_{1x} \quad (4)$$

$$Mgn=l_{2y}/l_{1y} \quad (5)$$

$$Mgn=(m \cdot l_{2x}/l_{1x}+n \cdot l_{2y}/l_{1y})/(m+n) \quad (6)$$

where m, n are arbitrary positive real numbers.

Figure 6:
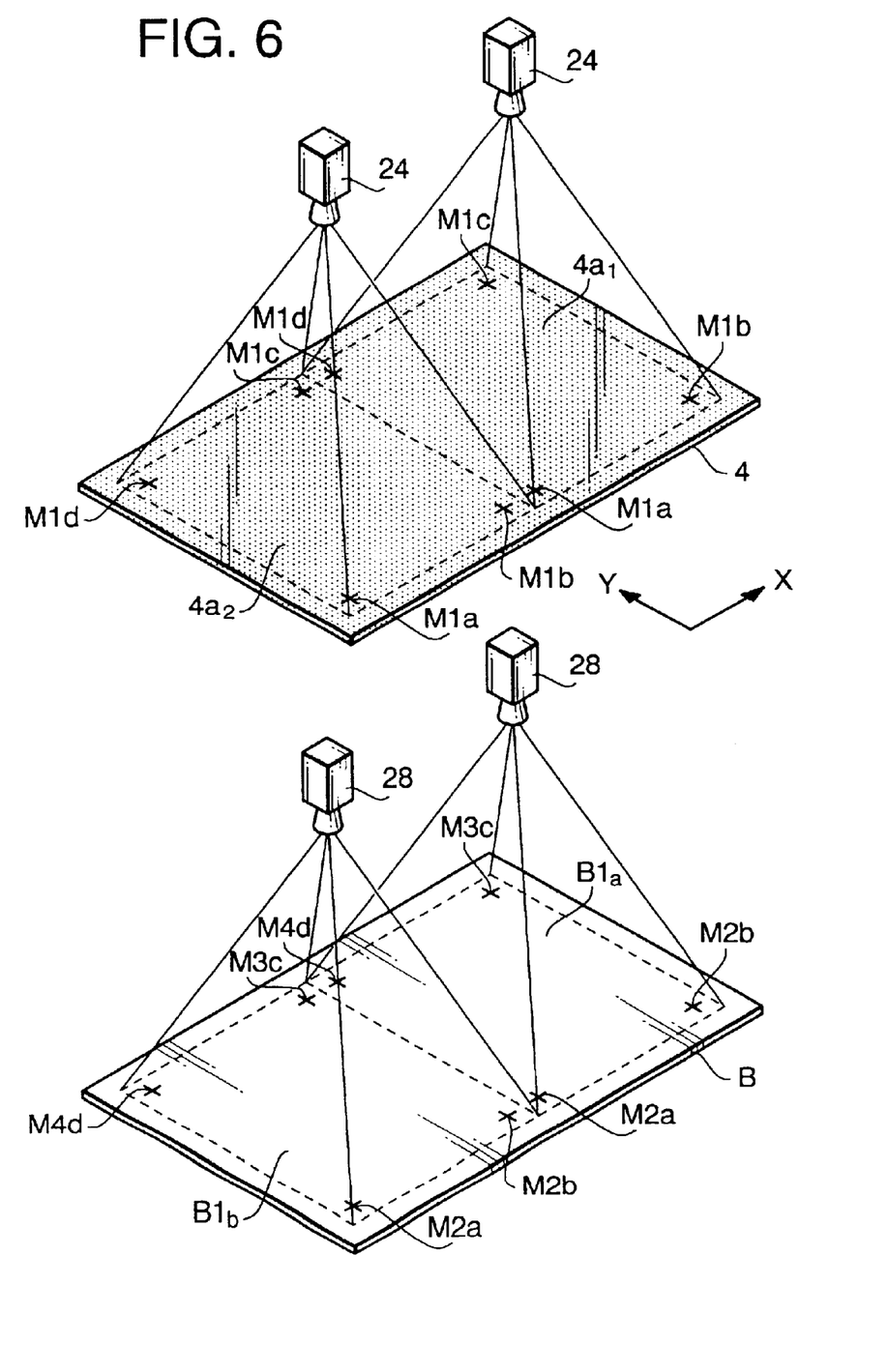
FIG. 6 schematically shows a concept of a projection aligner having a plurality of mask-position detectors and a plurality of object-position detectors according to an embodiment of the invention.

It should be noted that, in some embodiments of the invention, the projection aligner 1 is configured, as schematically shown in FIG. 6, to include a plurality of the mask-position detectors 24 and a plurality of the object-position detectors 28. Each of the mask-position detectors 24 are arranged to capture a different one of a plurality of small local areas (4$a_1$, 4$a_2$) defined on the mask 4, and each of the object-position detectors 28 are arranged to capture a different one of a plurality of small local areas (B1$_a$, B1$_b$) defined on the substrate B. Each of the local areas defined on the mask and the object are provided with four alignment marks. In the projection aligner 1 configured as above, the controller 10 determines the first and second size ratios SR1 and SR2 for each of the local areas defined on the substrate B. Then, the projection aligner 1 adjusts the magnification Mgn of the projecting optical system to a value between an average of the first size ratios, SR1$_m$, and an average of the second size ratios, SR2$_m$, which are defined as SR1$_m$=$l_{2xm}/l_{1xm}$ and SR2$_m$=$l_{2ym}/l_{1ym}$, where $l_{1xm}$ and $l_{1ym}$ respectively represent the mean value of $l_{1x}$ and $l_{1y}$ of the local areas defined on the mask 4, and $l_{2xm}$ and $l_{2ym}$ respectively represent the mean value of $l_{2x}$ and $l_{2y}$ of the local areas defined on the substrate B. In other words, the controller 10 may calculate one of the equations (2) through (6) by replacing $l_{1x}$, $l_{1y}$, $l_{2x}$ and $l_{2y}$ with $l_{1xm}$, $l_{1ym}$, $l_{2xm}$ and $l_{2ym}$, respectively, and adjust the magnification of the projecting optical system to the value Mgn obtained as a result of the calculation.

The adjustment of the magnification of the projecting optical system is achieved by moving the roof mirror 7 and the mirror 5 in the x-axis direction and z-axis direction, respectively.

Figure 7:
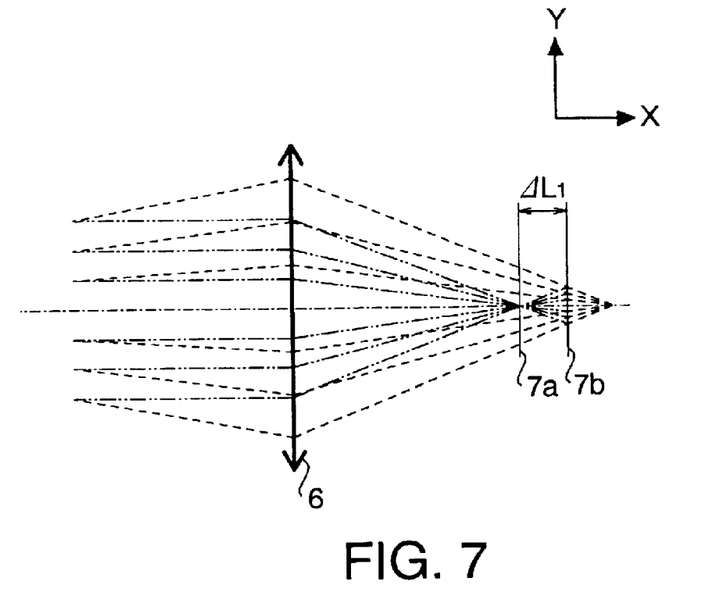
FIG. 7 schematically shows light rays passing through a lens unit and reflected by a roof mirror in the projection aligner of FIG. 1.
Figure 8:
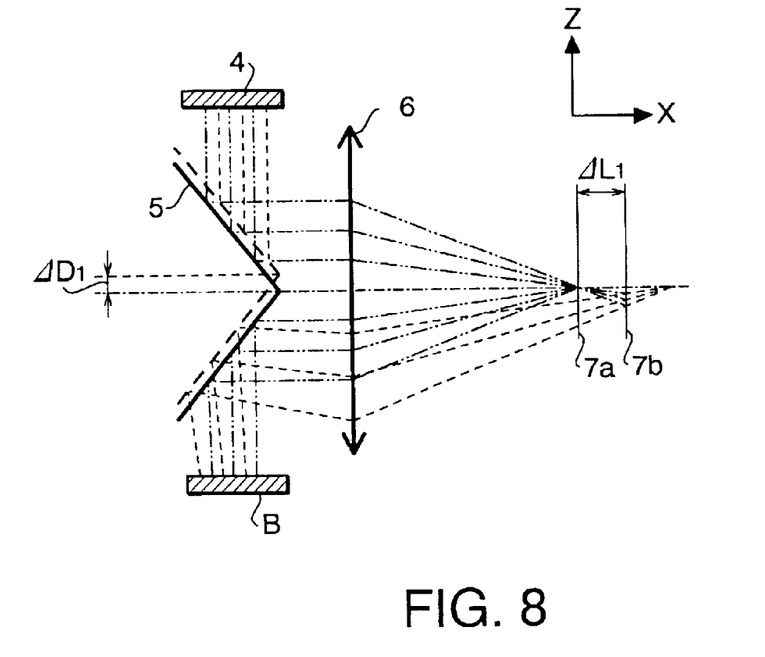
FIG. 8 schematically shows light rays traveling from the mask towards the substrate in the projection aligner of FIG. 1.

FIG. 7 schematically shows light rays passing through the lens unit 6 and reflected by the roof mirror 7 observed from the z-axis direction, and FIG. 8 schematically shows the light rays traveling from the mask 4 towards the substrate B observed from the y-axis direction. Note that, in both FIGS. 7 and 8, the lens unit 6 and the roof mirror 7 are represented as a single plane for simplification of the drawings.

In FIG. 7, the parallel light rays traveling from the mask 4 toward the lens unit 6 are indicated by chain double-dashed lines. If the roof mirror 7 reflects these light rays at the focal point of the lens unit 7 (see the plane 7$a$ in FIG. 7), then the light rays that have passed through the lens unit 6 again become parallel to the optical axis of the lens unit 6. However, if the roof mirror 7 is moved for a distance $\Delta L_1$ along the x-axis in a direction away from the lens unit 6 (see the plane 7$b$ in FIG. 7), which corresponds to shifting the exit pupil of the lens unit 6 in the same direction for a distance 2$\Delta L_1$, the light rays reflected by the roof mirror 7 declines against the optical axis of the lens unit 6 after passing therethrough (see the broken lines).

As may be understood from FIG. 8, if the light rays traveling toward the substrate B are not parallel to the optical axis of the lens unit 6, the size of the image projected onto the substrate B can be enlarged/reduced by varying the optical path length from the lens unit 6 to the photosensitive surface of the substrate B.

In the projection aligner 1 according to the present embodiment, the above-mentioned optical path length is changed by moving the mirror 5 in the z axis direction. This method is advantageous since the total optical path length $D_L$ does not change with the movement of the mirror 5 and therefore the image of the mask pattern is always clearly formed on the substrate B irrespective the scaling factor of the image. It should be also noted that the location where the optical axis of the projecting optical system impinges on the substrate B does not displaces with the movement of the mirror 5 in the z-axis direction.

If the roof mirror 7 is moved to a position of which the distance from the lens unit 6 is longer than the focal length of the lens unit 6, then the image on the substrate B can be enlarged by moving the mirror 5 toward the substrate B to decrease the length of the optical path from the lens-unit 6 to the substrate B, and vice versa. In contrast, if the roof mirror 7 is located between the lens unit 6 and its focal point, then the image on the substrate B can be enlarged by moving the mirror 5 away from substrate B to increase the length of the optical path between the lens unit and the substrate B, and vice versa.

The displacement $\Delta L_1$ of the roof mirror 7 in the x-axis direction from the focal point of the lens unit 6 and the displacement $\Delta D_1$ of the mirror 5 in the z-axis direction from the location at where the optical path length from the lens unit 6 to the substrate B is the same as the focal length of the lens unit 6 should satisfy the following relation to adjust the magnification of the projection optical system to Mgn:

$$(Mgn-1)=-2\times\Delta D_1\times\Delta L_1/f^2 \quad (7)$$

Thus, the controller 10 positions the roof mirror 7 and the mirror 5 so that the equation (7) is satisfied.

Figure 9:
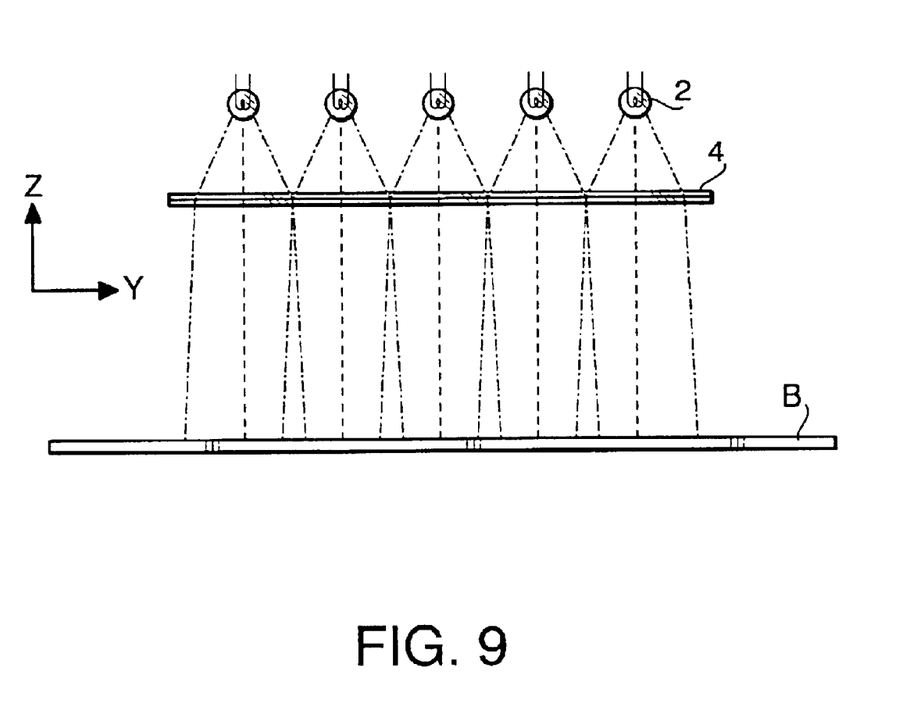
FIG. 9 schematically shows the light beams projected onto the substrate in the projection aligner of FIG. 1 in which projection optical systems are adjusted to enlarge the images projected onto the substrate.

FIG. 9 schematically shows the light beams projected from the light sources 2 onto the substrate B in the projection aligner 1 in which the projection optical systems are adjusted to enlarge the images projected onto the substrate B. Note that the collimating lenses 3, the mirrors 5, the lens units 6 and the roof mirrors 7 are omitted in FIG. 8 for the simplification of the drawing.

As described above, the projection optical system in the projection aligner 1 of the present embodiment is able to enlarge/reduce the image projected onto the substrate B by shifting the roof mirror 7 and the mirror 5 in x-axis and z-axis directions, respectively. However, when the plurality of the projection optical systems enlarge or reduce the images, the images on the substrate B overlap to each other or gaps appear between the images.

Since such overlapping of the images and gaps between the images inhibit correct transfer of the mask pattern onto the substrate B, the locations of the images projected onto the substrate B are adjusted in the y-axis direction so that such overlapping or gaps do not occur. In the projection aligner 1 according to the present embodiment, the above-mentioned adjustment, which will be referred hereinafter as "image location adjustment", is achieved by moving the roof mirror 7 in y-axis direction as well as moving the mirror 5 in z-axis direction.

Figure 10:
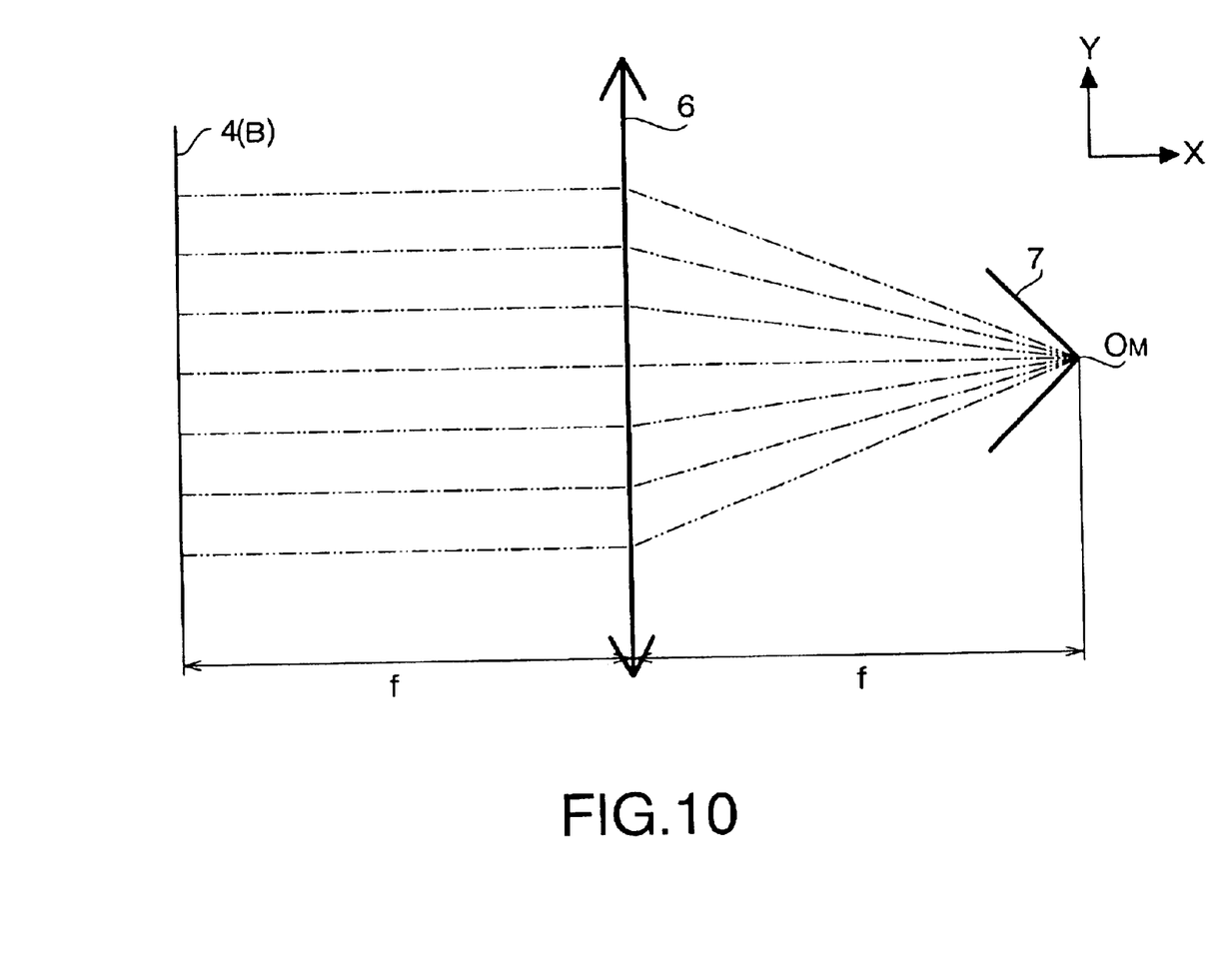
FIGS. 10 and 11 schematically shows the light rays traveling from the mask to the substrate in the projection aligner of FIG. 1 before and after image location adjustment is achieved, respectively.
Figure 11:
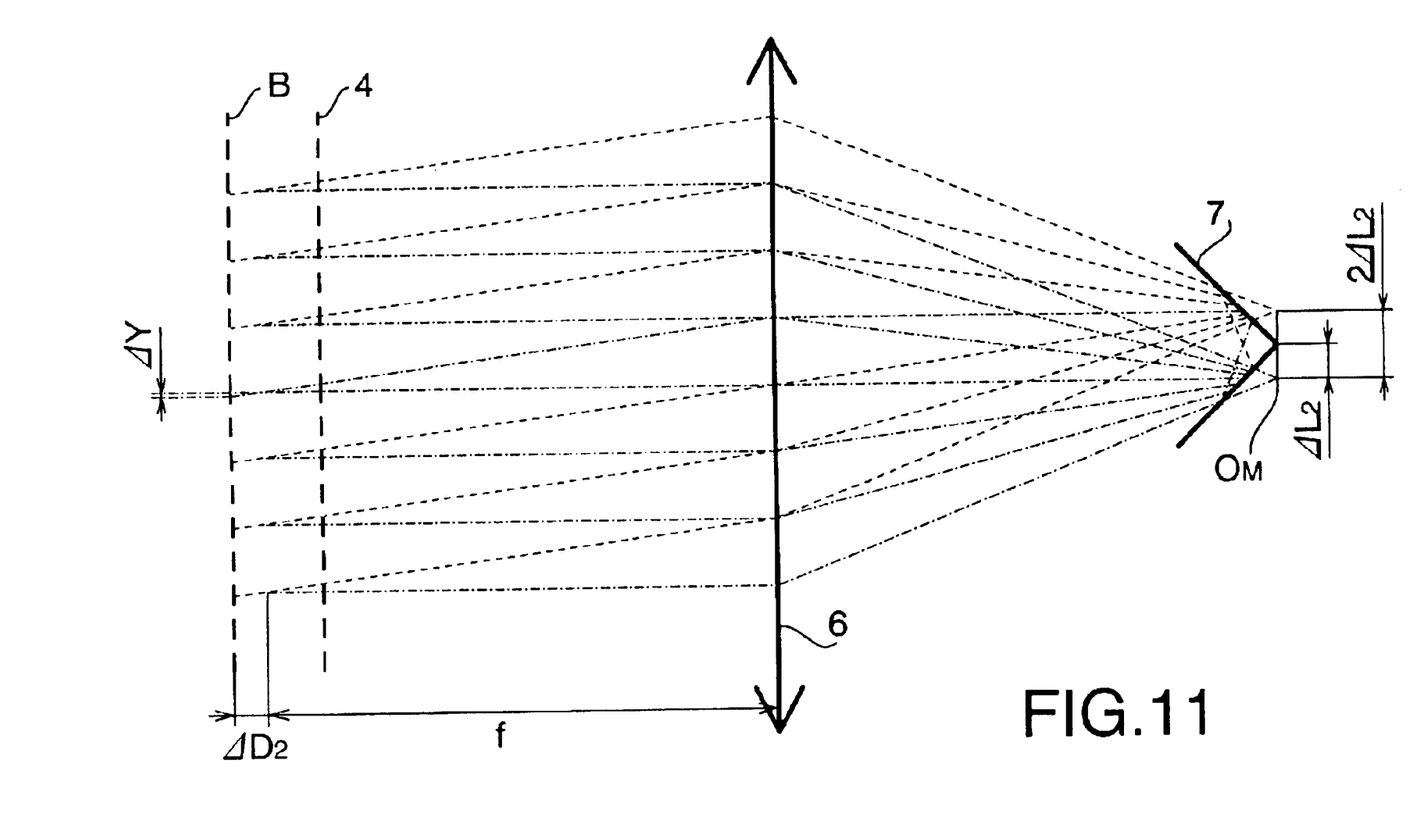

FIGS. 10 and 11 schematically shows the light rays traveling from the mask 4 to the substrate B. In particular, FIG. 10 shows the light rays in the projection aligner 1 in which the image location adjustment is not yet performed. FIG. 11 shows the light rays in the projection aligner 1 in which the image location adjustment is performed. In FIG. 11, the chain double-dashed lines represent the light rays traveling toward the roof mirror 7 and the broken lines the light rays traveling toward the substrate B after being reflected by the roof mirror 7. Note that the lens unit 6 is represented as a single plane and the mirror 5 is omitted in both FIGS. 10 and 11 for simplifying the drawings.

In FIG. 10, the mask 4 and the photosensitive surface of the substrate B are both located at a distance from the lens unit 6 equal to the focal length thereof. The roof mirror 7 is located at the focal point $O_M$ of the lens unit 6. In FIG. 10, the light rays that travel from the mask 4 toward the lens unit 6 enter the lens unit 6 in parallel to the optical axis thereof. After passing through the lens unit 6, the light rays are reflected by the roof mirror 7, pass through the lens unit 6 again, and travel in parallel to the optical axis of the lens unit 6. Accordingly, the location on the substrate B where the image is projected by those light rays does not change even if the optical path length from the lens unit 6 to the substrate B is varied by moving the mirror 5 (which is omitted in FIG. 9).

If the roof mirror 7 is moved, as shown in FIG. 11, in the y-axis direction for a distance $\Delta L_2$ from the focal point $O_M$ (or from the optical axis of the lens unit 6), the position of the exit pupil of the lens unit 6 moves for $2\Delta L_2$ from the focal point $O_M$ in the same direction. As a result, the light rays reflected by the roof mirror 7 inclines against the optical axis of the lens unit 6 after passing therethrough.

Accordingly, if the optical path length from the lens unit 6 to the substrate B is changed by shifting the mirror 5 in the z-axis direction, the location on the substrate B where the image is formed displaces in the y-axis direction. The displacement of the image in the y-axis direction $\Delta Y$ is related to displacement of the mirror 5 in the z-axis direction $\Delta D_2$, or the amount of change of the optical length from the lens unit 6 to the substrate B, and the displacement of the roof mirror 7 in y-axis direction $\Delta L_2$ by the following equation:

$$\Delta Y = -\Delta D_2 \times 2\Delta L_2 / f \qquad (8)$$

Note that $\Delta D_2$ in equation (8) should be equal to $\Delta D_1$ of equation (7) since both $\Delta D_1$ and $\Delta D_2$ represent the displacement of the mirror 5 in the z-axis direction.

The displacement $\Delta Y$ for the image projected by the a-th projecting optical system from the most left or right one in FIG. 11 is determined from the following equation:

$$\Delta Y = (a - (n_L + 1)/2) \times (Mgn - 1) \times W \qquad (9)$$

where $n_L$ is the total number of the projecting optical systems included in the projection aligner 1, and constant number W is the length in the y-axis direction of the unmagnified image projected onto the substrate B by one projecting optical system.

In the projection aligner 1 according to the present embodiment, the controller 10 determines the displacement $\Delta L_2$ of the roof mirror 7 in the y-axis direction so that the equations (8) and (9) are satisfied.

Figure 12:
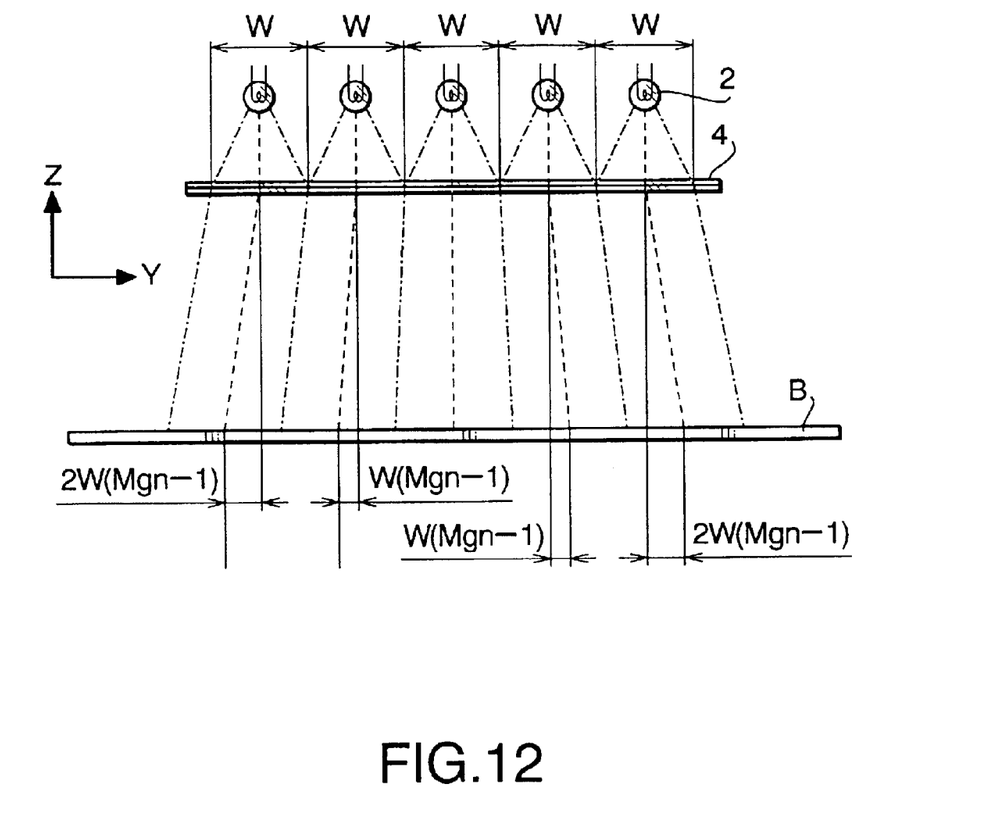
FIG. 12 schematically shows the light beams projected from the light sources onto the substrate in the projection aligner of FIG. 1 in which the image location adjustment is achieved.

FIG. 12 schematically shows the light beams projected from the light sources 2 onto the substrate B in the projection aligner 1 in which the image location adjustment is performed. Note that the collimating lenses 3, the mirrors 5, the lens units 6 and the roof mirrors 7 are omitted in FIG. 12 for simplifying the drawing.

As shown in FIG. 12, the location of the image formed by the projection optical system at the center does not shifts in the y-axis direction, while the image formed by the n-th projection optical system counted from the one at the center shifts for a distance W(Mgn−1)×n. As a result, the images projected onto the substrate B do not overlaps to each other and no gaps appear between the images. Thus, the image location adjustment of the projection aligner 1 allows correct transfer of the mask pattern onto the substrate B.

After the magnifications of the projecting optical systems are adjusted and the image location adjustment is performed as above, the controller 10 operates the mask-driving mechanism 14 and the object-driving mechanism 15 to synchronously move the mask 4 and the substrate B in the x-axis direction to scan the light beams L from the light sources 2 across the mask 4 and the substrate B. The controller 10 moves the mask 4 at a predetermine velocity $V_M$ and the substrate B at a velocity $V_B = Mgn \times V_M$. In addition, the controller 10 moves the mask 4 and the substrate B such that the image at the center of the mask pattern area 4a is transferred on the center of the pattern area B1 of the substrate B.

By operating the projection aligner 1 according to the present embodiment of the invention as above, the mask pattern of the mask 4 is transferred onto the substrate B without having significant displacement between the transferred pattern and the through holes formed to the substrate B.

It should be noted that the embodiment of the invention described above may be modified in various ways. For example, the substrate height detecting unit 38 may also be arranged such that the laser beam LB emitted from the laser source 38a impinges on the photosensitive surface of the substrate B in the vicinity of where one of the light beams from the light sources 2 strikes the substrate B. In this case, the controller 10 may monitor the output of the substrate height detecting unit 38 during the exposure of the substrate B, and control the position of the mirrors 5 in the x-axis direction so that the total optical path length $D_L$ satisfies the condition $D_L = 2f$ substantially all the time during the exposure. With this, the projection aligner 1 becomes able to correctly transfer the mask pattern on a substrate even if the substrate has uneven thickness.

The present disclosure relates to the subject matters contained in Japanese Patent Applications Nos. P2001-394058 and P2001-394413, both filed on Dec. 26, 2001, which are expressly incorporated herein by reference in their entirety.

What is claimed is:

1. A projection aligner arranged to scan a plurality of light beams over a mask in a first direction to transfer an image of a pattern formed on the mask to an object by the light beams passed through the mask, said projection aligner comprising:

a plurality of optical systems, each of said optical systems projecting a different one of the light beams passed through the mask onto the object to transfer a different part of the image of the pattern on the mask to the object;

wherein each of said optical systems includes:

a lens unit having a positive power, said lens unit having an optical axis parallel to the first direction;

a roof mirror provided on one side of said lens unit to reflect back light passed through said lens unit, said roof mirror including reflection surfaces arranged perpendicular to said mask and being supported movably in the first direction and in a second direction, the second direction being parallel to the object and perpendicular to the first direction; and a deflector provided on the other side of said lens unit, said deflector having first and second mirrors, said first mirror deflecting the light beam passed through the mask toward said reflector through said lens unit, said second mirror deflecting the light beam reflected by said roof mirror and passed through the lens unit toward the object, said deflector being supported movably in a direction perpendicular to said object.

2. The projection aligner according to claim 1, wherein said deflector is a triangle prism whose section is an isosceles right triangle, said first and second mirrors being formed on side surfaces of said triangle prism forming a right angle.

3. The projection aligner according to claim 1, wherein said roof mirror is located in the vicinity of a focal point of said lens unit.

4. The projection aligner according to claim 1, further comprising:

a plurality of mirror driving mechanisms arranged to move respective roof mirrors in both the first direction and the second direction;

a plurality of deflector driving mechanisms arranged to move respective deflectors in the direction perpendicular to the object;

a size detector that detects the size of the object;

a controller that operates said mirror driving mechanisms and said deflector driving mechanisms to adjust the size of the image formed on the object by each light beam in accordance with the detection of said size detector.

5. The projection aligner according to claim 4, wherein said size detector includes:

a camera arranged to capture an image of said object; and an image processor adapted to determine the size of the object from the image captured by said camera.

6. The projection aligner according to claim 5, wherein said size detector determines the size of the object based on alignment marks formed on the object.

7. The projection aligner according to claim 4, wherein said size detector includes:

a first camera arranged to capture an image of said object;

a second camera arranged to capture an image of said mask; and an image processor adapted to determine the size of the object and the mask from the image captured by said first and second camera, and wherein said controller determines the magnification of the optical systems based on a ratio of the size of the object to the size of the mask.

8. The projection aligner according to claim 7, wherein said image processor determines the sizes of the object and the mask based on alignment marks formed on the object and the mask, respectively.

9. A projection aligner arranged to scan a plurality of light beams over a mask in a first direction to transfer an image of a pattern formed on the mask to an object by the light beams passed through the mask, said projection aligner comprising:

a size adjusting device to adjust a size of each image formed on the object;

an image shifting device to shift each image formed on the object independently so as to prevent the images from overlapping or clearance forming when the size of each image is adjusted, said image shifting device moving each image on the object in the first direction;

a lens unit having a positive power, said lens unit having an optical axis parallel to the first direction;

a roof mirror provided on one side said lens unit to reflect back light passed through said lens unit, reflection surfaces thereof arranged perpendicular to said mask, said roof mirror being supported movably in the first direction and in a second direction, the second direction being parallel to the object and perpendicular to the first direction; and a deflector provided on the other side of said lens unit, said deflector having first and second mirrors, said first mirror deflecting the light beam passed through the mask toward said roof mirror through said lens unit, said second mirror deflecting the light beam reflected by said roof mirror and passed through the lens unit toward the object, said deflector being supported movably in a third direction perpendicular to both the first and second directions, said image shifting device moving said roof mirror in the second direction and the deflector in the third direction.

* * * * *